United States Patent [19]
Tung

[11] Patent Number: 6,023,092
[45] Date of Patent: Feb. 8, 2000

[54] SEMICONDUCTOR RESISTOR FOR WITHSTANDING HIGH VOLTAGES

[75] Inventor: Ming-Tsung Tung, Hsin-Chu Hsien, Taiwan

[73] Assignee: United Microelectronics Corp., Hsin-Chu, Taiwan

[21] Appl. No.: 09/293,970

[22] Filed: Apr. 19, 1999

[51] Int. Cl.[7] ........................................ H01L 29/00
[52] U.S. Cl. .......................... 257/547; 257/404; 257/409; 257/488; 257/490; 257/536; 257/537; 257/547
[58] Field of Search .................................. 257/404, 409, 257/488, 490, 536, 537, 547

*Primary Examiner*—Jerome Jackson, Jr.
*Assistant Examiner*—Edgarlo Ortiz
*Attorney, Agent, or Firm*—Winston Hsu

[57] ABSTRACT

A resistor on a semiconductor wafer comprising a silicon substrate, a first doped layer in a predetermined area on the silicon substrate, a second doped layer within a predetermined area of the first doped layer, a dielectric layer above the first and second doped layers on the silicon substrate, a passivation layer on the dielectric layer, and a conducting layer between the dielectric layer and the passivation layer. The silicon substrate contains dopants that characterize it as an n-type (or p-type) semiconductor. The first doped layer functioning as a resistor layer is a p-type (or n-type) semiconductor and forms a first pn-junction at its interface with the silicon substrate to prevent electrical leakage. The second doped layer is a n-type (p-type) semiconductor and forms a second pn-junction at its interface with the first doped layer that prevents electrical leakage. The passivation layer has a plurality of charges at fixed positions. The conducting layer prevents the electric field generated by the charges of the passivation layer from reducing the breakdown voltages of the first and second pn-junctions at their intersections with the surface of the dielectric layer.

6 Claims, 3 Drawing Sheets

SEMICONDUCTOR RESISTOR FOR WITHSTANDING HIGH VOLTAGES

BACKGROUND OF THE INVENTION

1. Field of the Invention

The invention relates to a resistor positioned on a semiconductor wafer, and more particularly, to a semiconductor resistor for withstanding high voltages.

2. Description of the Prior Art

Resistors used in a high voltage circuits, such as radio frequency integrated circuits (RFIC), microwave frequency integrated circuits, or high power integrated circuits, are typically formed in a rectangular-shaped spiral and have a large surface area. This enables them to withstand high voltages.

Please refer to FIG. 1 and FIG. 2. FIG. 1 is a perspective diagram of a prior art semiconductor resistor 10 for withstanding high voltages. FIG. 2 is a top view diagram of the doped layer 14 shown in FIG. 1. The semiconductor resistor 10 comprises a Si substrate 12 with dopants characterizing it as an n-type semiconductor, a doped layer 14 with dopants characterizing it as a p-type semiconductor that functions as a resistor layer in a predetermined area on the silicon substrate 12, a dielectric layer 16 positioned on the silicon substrate 12 above the doped layer 14, and a passivation layer 18 positioned on the dielectric layer 16. The junction of the doped layer 14 and the silicon substrate 12 forms a pn-junction to prevent electrical leakage.

The resistor 10 is produced by implanting ions in a predetermined area on the silicon substrate 12 to form the doped layer 14 as a p-type semiconductor. As shown in FIG. 2, the doped layer 14 is formed in a rectangular-shaped spiral in which the doped layer 14 traces a rectangular path as it turns in on itself. The dielectric layer 16 is then deposited onto the silicon substrate 12 and doped layer 14. Contact windows (not shown) are formed at the two ends of the resistor 10 using photolithography and etching. Conduct windows are used to connect the resistor 10 with other components on the chip. Finally, the passivation layer 18 is deposited on the surface of the resistor 10.

With the deposition of the passivation layer 18, some charged ions are mixed with the depositing particles, and a plurality of fixed charges at fixed positions are generated. An electric field is generated by the charges of the passivation layer 18 when the resistor 10 is connected. This reduces the breakdown voltage of the pn-junction of the silicon substrate 12 and the doped layer 14 and generates electrical leakage. Since the doped layer 14 is formed on the silicon substrate 12 in a rectangular-shaped spiral structure, it forms right-angle corners. When the resistor 10 is used at high voltages, a strong electric field is generated at a right-angled corner of the doped layer 14. This reduces the voltage value of the resistor 10.

SUMMARY OF THE INVENTION

It is therefore a primary objective of the present invention to provide a resistor for withstanding high voltages, the resistor can prevent the fixed charges of the passivation layer from generating electric field to avoid electrical leakage.

Briefly, in a preferred embodiment, the present invention provides a resistor positioned on a semiconductor wafer comprising:

a silicon substrate containing dopants in it as a first-type semiconductor which is either an n-type or p-type semiconductor;

a first doped layer formed by implanting ions in a predetermined area on the silicon substrate and functioning as a resistor layer, the first doped layer being a second-type semiconductor which is either an n-type or p-type semiconductor but different from the first-type semiconductor, the first doped layer forming a first pn-junction at its interface with the silicon substrate to prevent electrical leakage;

a second doped layer formed by implanting ions in a predetermined area of the first doped layer, the second doped layer being the first-type semiconductor and forming a second pn-junction at its interface with the first doped layer to prevent electrical leakage;

a dielectric layer formed on the silicon substrate and positioned above the first and the second doped layers;

a passivation layer positioned on the dielectric layer having a plurality of charges at fixed positions; and a conducting layer positioned between the dielectric layer and the passivation layer above the intersections between the surface of the dielectric layer and the first pn-junction and between the surface of the dielectric layer and the second pn-junction for preventing an electric field generated by the charges of the passivation layer from reducing the breakdown voltages of the first and second pn-junctions at their intersections with the surface of the dielectric layer.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
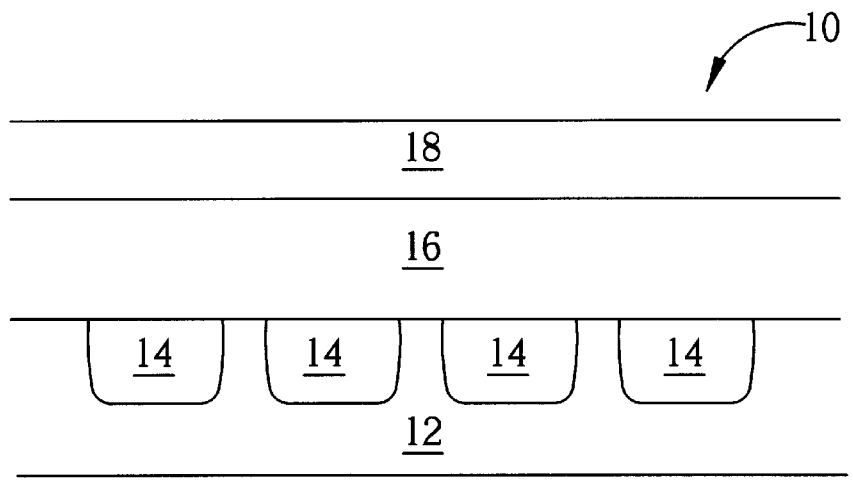
FIG. 1 is a perspective diagram of a prior art semiconductor resistor for withstanding high voltages.
Figure 2:
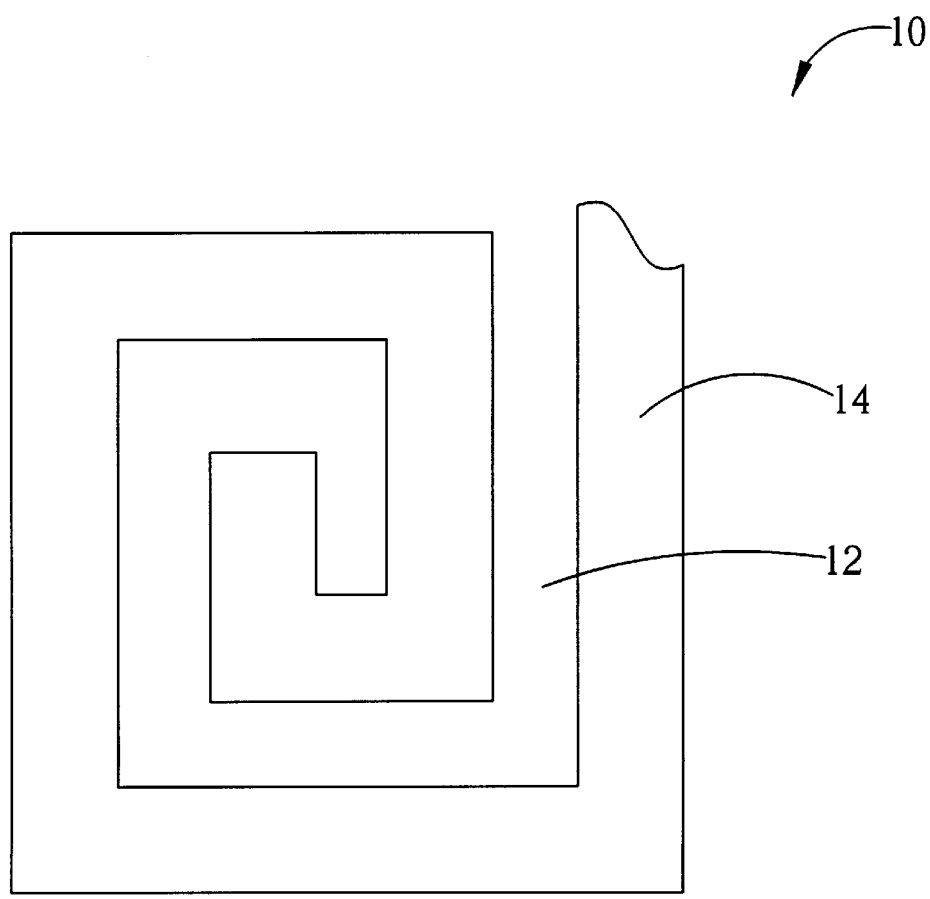
FIG. 2 is an upper view diagram of the doped layer shown in FIG. 1.
Figure 3:
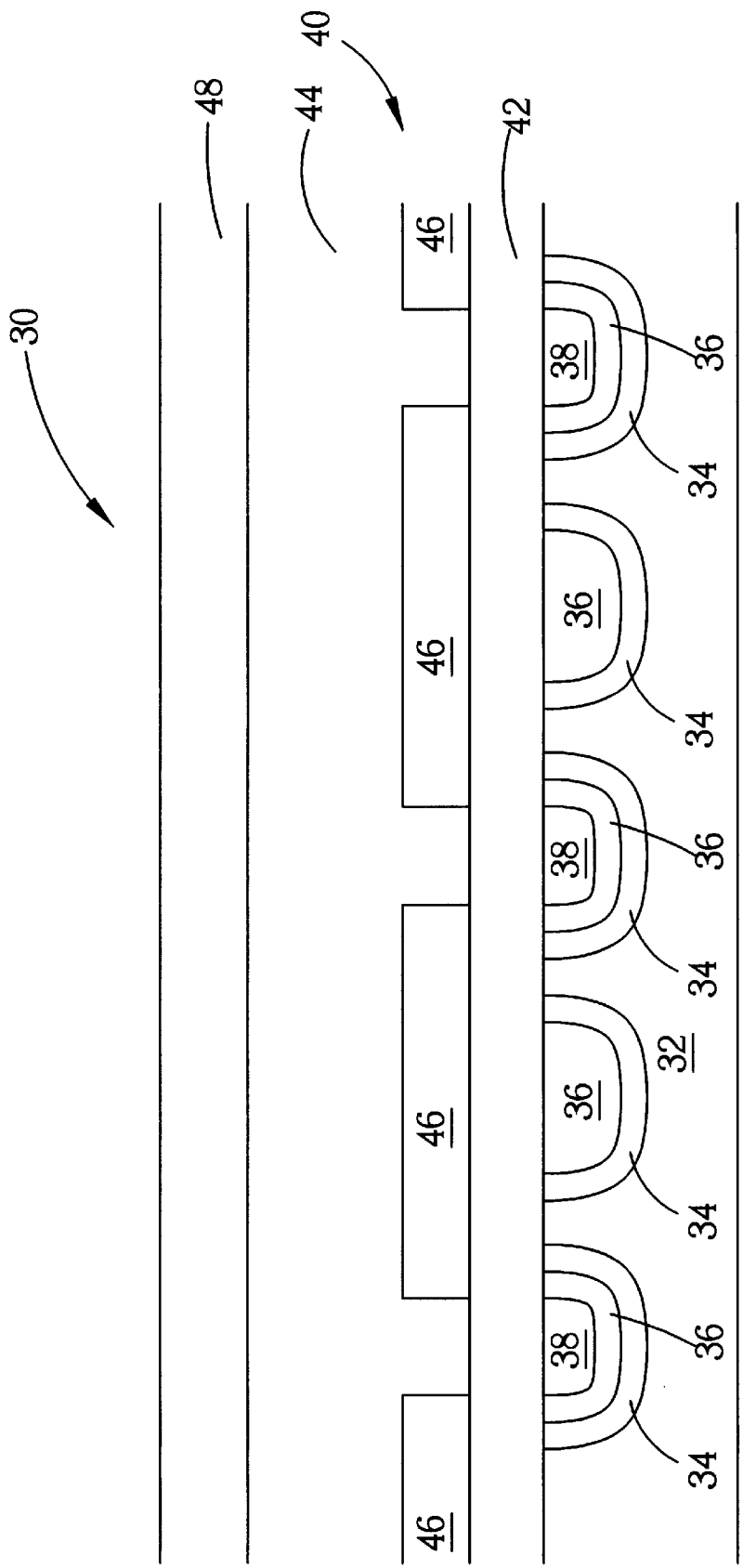
FIG. 3 is a perspective diagram of semiconductor resistor for withstanding high voltages.
Figure 4:
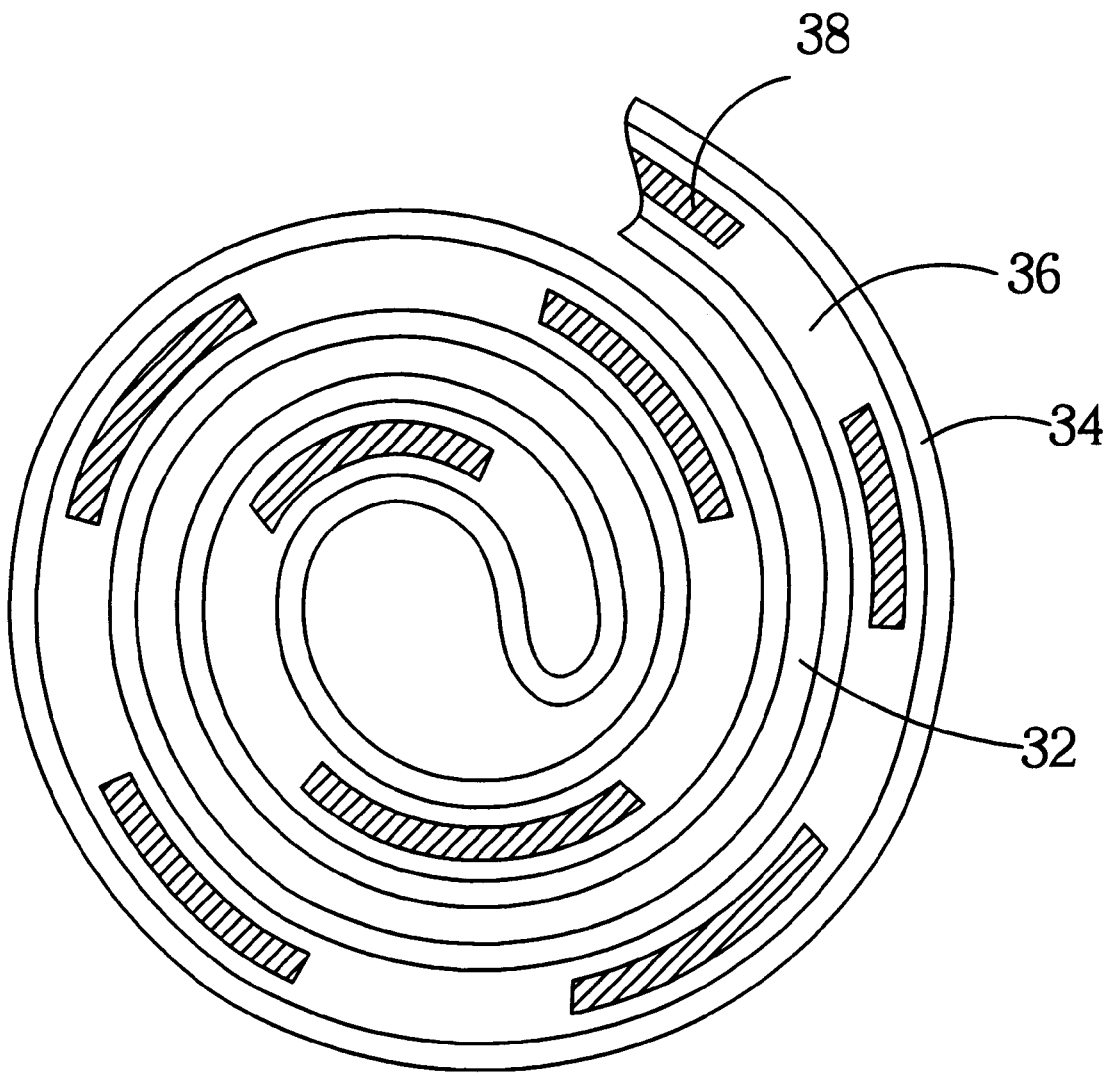
FIG. 4 is an upper view diagram of the first, second and third doped layers shown in FIG. 3.

Please refer to FIG. 3 and FIG. 4. FIG. 3 is a perspective diagram of semiconductor resistor 30 for withstanding high voltages. FIG. 4 is a top view diagram of the first, second and third doped layers 34, 36, 38 shown in FIG. 3. The present invention is a resistor 30 positioned on a semiconductor wafer for withstanding high voltages. The resistor 30 comprises a silicon substrate 32, a first doped layer 34 installed in a predetermined area on the silicon substrate 32, a second doped layer 36 installed in a predetermined area of the first doped layer 34, a plurality of third doped layers 38 installed in a plurality of predetermined areas within the second doped layer 36, a dielectric layer 40 comprising a first dielectric layer 42 and a second dielectric layer 44 and formed on the silicon substrate 32 above the first and the second doped layers 34, 36, a passivation layer 48 positioned on the dielectric layer 40, and a conducting layer 46 positioned between the dielectric layer 40 and the passivation layer 48.

The resistor 30 is produced by first implanting ions in a predetermined area on the silicon substrate 32 to form the first doped layer 34. This layer functions as a resistor layer.

The second doped layer 36 is then formed by implanting ions in a predetermined area in the first doped layer 34. Likewise, ions are implanted into predetermined areas in the second doped layer 36 to form a plurality of third doped layers 38. As shown in FIG. 4, the first doped layer 34 is formed in a spiral shaped strip on the silicon substrate 32. The second doped layer 36 is formed in a spiral shaped strip within the first doped layer 34. The distance between each pair of neighboring third doped layer 38 portions is less than a predetermined distance. The predetermined areas of the third doped layers 38 are used as an electrical terminal for stabilizing the voltage of the second doped layer 36.

The first dielectric layer 42, conducting layer 46 and second dielectric layer 44 is deposited in sequence on the silicon substrate 32, first doped layer 34 and second doped layer 36. Contact windows (not shown) are formed at the two ends of the resistor 30 using photolithography and etching. A contact plug that penetrates the first and second dielectric layers 42, 44. The resistor 30 connects with other components on the semiconductor chip through the contact plug. Finally, the passivation layer 48 is deposited on the surface of the resistor 30. The passivation layer 48 comprises a plurality of charges at fixed positions.

In the resistor 30, the silicon substrate 32 contains dopants in it as a first-type semiconductor which is either an n-type or p-type semiconductor. The first doped layer 34 is a second-type semiconductor which is either an n-type or p-type semiconductor but different from the first-type semiconductor. The first doped layer 34 forms a first pn-junction at its interface with the silicon substrate 32 to prevent electrical leakage. The second doped layer 36 is a first-type semiconductor and forms a second pn-junction at its interface with the first doped layer 34 to prevent electrical leakage. Each of the third doped layers 38 is the first-type semiconductor with a doping density greater than that of the second doped layer 36 and is used as an electrical terminal of the second doped layer 36.

Because the first doped layer 34 is formed in a spiral shaped strip on the silicon substrate 32 and the second doped layer 36 is formed in a spiral shaped strip within the first doped layer 34, the arc shaped periphery of the spiral shaped strip equilibrates the breakdown voltage between the first pn-junction and the surface of the dielectric layer 40 and the breakdown voltage between the second pn-junction and the surface of the dielectric layer 40.

The conducting layer 46 is formed of aluminum(Al), copper (Cu), or alloy of aluminum and copper, and is installed between the dielectric layer 40 and the passivation layer 48 above the junctions of the dielectric layer 40 and the first pn-junction and the junctions of the dielectric layer 40 and the second pn-junction. The conducting layer 46 further comprises a conductive end (not shown) for connecting a fixed voltage source so as to prevent the electric field generated by the charges of the passivation layer 48 from reducing the breakdown voltages of the first and second pn-junctions at their intersections with the surface of the dielectric layer 40. And thus electrical leakage of the resistor 30 using at high voltages will be prevented.

In contrast to the prior art resistor 10, the resistor 30 according to the present invention comprises the first doped layer 34 and second doped layer 36 in a spiral shaped strip that equilibrates the breakdown voltage of the first and second pn-junctions. The resistor 30 further comprises the conducting layer 46 installed between the dielectric layer 40 and passivation layer 48 for preventing the electric field generated by the charges of the passivation layer 48 from reducing the breakdown voltages of the first and second pn-junctions at their intersections with the surface of the dielectric layer 40 so as to prevent electrical leakage of the resistor 30.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A resistor positioned on a semiconductor wafer comprising:

a silicon substrate containing dopants in it as a first-type semiconductor which is either an n-type or p-type semiconductor;

a first doped layer formed by implanting ions in a predetermined area on the silicon substrate and functioning as a resistor layer, the first doped layer being a second-type semiconductor which is either an n-type or p-type semiconductor but different from the first-type semiconductor, the first doped layer forming a first pn-junction at its interface with the silicon substrate to prevent electrical leakage;

a second doped layer formed by implanting ions in a predetermined area of the first doped layer, the second doped layer being the first-type semiconductor and forming a second pn-junction at its interface with the first doped layer to prevent electrical leakage;

a dielectric layer formed on the silicon substrate and positioned above the first and the second doped layers;

a passivation layer positioned on the dielectric layer having a plurality of charges at fixed positions; and a conducting layer positioned between the dielectric layer and the passivation layer above the intersections between the surface of the dielectric layer and the first pn-junction and between the surface of the dielectric layer and the second pn-junction for preventing an electric field generated by the charges of the passivation layer from reducing the breakdown voltages of the first and second pn-junctions at their intersections with the surface of the dielectric layer.

2. The resistor of claim 1 wherein the first doped layer is formed in a spiral shaped strip on the silicon substrate over which the arc shaped periphery of the spiral shaped strip equilibrates the breakdown voltage of the first pn-junction along the intersection between the first pn-junction and the surface of the dielectric layer.

3. The resistor of claim 2 wherein the second doped layer is formed in a spiral shaped strip within the spiral shaped strip of the first doped layer over which the arc shaped periphery of the second doped layer equilibrates the breakdown voltage of the second pn-junction along the intersection between the second pn-junction and the surface of the dielectric layer.

4. The resistor of claim 1 further comprising a plurality of third doped layers formed by implanting ions in a plurality of predetermined areas within the second doped layer wherein each of the third doped layers is the first-type semiconductor with a doping density greater than that of the second doped layer and is used as an electrical terminal for stabilizing the second doped layer, and the distance between each pair of neighboring third doped layers is less than a predetermined distance.

5. The resistor of claim 1 wherein the conducting layer is electrically connected with a power source to prevent the charges of the passivation layer from reducing the breakdown voltages of the first and second pn-junctions at their intersections with the surface of the dielectric layer.

6. The resistor of claim 5 wherein the conducting layer is formed of aluminum(Al), copper(Cu), or alloy of aluminum and copper.

* * * * *